(12) United States Patent
Shin (10) Patent No.: US 9,442,797 B2
(45) Date of Patent: Sep. 13, 2016

(54) MEMORY SYSTEM

(71) Applicant: SK hynix Inc., Gyeonggi-do (KR)

(72) Inventor: Beom Ju Shin, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 231 days.

(21) Appl. No.: 14/283,954

(22) Filed: May 21, 2014

(65) Prior Publication Data

US 2015/0178156 A1 Jun. 25, 2015

(30) Foreign Application Priority Data

Dec. 24, 2013 (KR) ........................ 10-2013-0162649

(51) Int. Cl.
| | | |
|---|---|---|
| *G11C 29/00* | (2006.01) | |
| *G06F 11/10* | (2006.01) | |
| *G06F 11/16* | (2006.01) | |
| *G11C 7/14* | (2006.01) | |
| *G11C 11/56* | (2006.01) | |
| *G11C 29/42* | (2006.01) | |
| *G11C 29/44* | (2006.01) | |
| *G11C 29/52* | (2006.01) | |
| *G11C 29/50* | (2006.01) | |
| *G11C 29/04* | (2006.01) | |

(52) U.S. Cl.
CPC ....... *G06F 11/1072* (2013.01); *G06F 11/1612* (2013.01); *G11C 7/14* (2013.01); *G11C 11/5642* (2013.01); *G11C 29/42* (2013.01); *G11C 29/44* (2013.01); *G11C 29/52* (2013.01); *G11C 2029/0409* (2013.01); *G11C 2029/0411* (2013.01); *G11C 2029/5004* (2013.01)

(58) Field of Classification Search
CPC .......... G06F 11/1072; G06F 11/1612; G11C 2029/5004; G11C 29/42; G11C 11/5642; G11C 29/52; G11C 2029/0409; G11C 2029/0411
See application file for complete search history.

(56) References Cited

U.S. PATENT DOCUMENTS

2010/0122148 A1* 5/2010 Flynn .................... G06F 11/108
714/773
2011/0038212 A1* 2/2011 Uchikawa ........... G11C 11/5642
365/185.18

FOREIGN PATENT DOCUMENTS

KR 1020090099757 9/2009

* cited by examiner

*Primary Examiner* — Guy Lamarre
(74) *Attorney, Agent, or Firm* — IP & T Group LLP (57) ABSTRACT

A memory system is provided. The memory system includes a memory device suitable for reading out data from memory cells by a plurality of read voltages having various levels, and a controller suitable for updating probabilistic information based on the read out data when the read out data is input to the controller, and performing an error correction operation by the updated probabilistic information, wherein the controller updates the probabilistic information a predetermined number of times that the memory device reads out the data.

16 Claims, 8 Drawing Sheets

MEMORY SYSTEM

CROSS-REFERENCE TO RELATED APPLICATION

The present application claims priority to Korean patent application number 10-2013-0162649 filed on Dec. 24, 2013, in the Korean Intellectual Property Office, the entire disclosure of which is incorporated by reference herein.

BACKGROUND

1. Technical Field

Various embodiments of the present invention relate to a memory system, and more specifically, to a memory system including a memory device and a controller.

2. Related Art

A flash memory device may store two or more data bits per cell in order to store a larger amount of information in a limited storage space. As the number of data bits stored in a memory cell is increased, the number of threshold voltage distributions is increased and the distance between the threshold voltage distributions is decreased. Accordingly, adjacent threshold voltage distributions may overlap each other.

As adjacent threshold voltage distributions overlap each other, the data read from the cell may include a large number of error bits (several to several tens of error bits). Accordingly, there is an imperative need for technology to efficiently detect and correct errors of data read in the flash memory device storing multi-bit data.

SUMMARY

Various embodiments of the present invention are directed to a memory system capable of efficiently providing supplementary information that is required for error correction while improving the data reliability without increasing the chip size.

One embodiment of the present invention may provide a memory system including a memory device and a controller. The memory device may be suitable for reading out data from memory cells by a plurality of read voltages having various levels. The controller may be suitable for updating probabilistic information based on the read out data when the read out data is input to the controller, and performing an error correction operation by the updated probabilistic information. The controller may update the probabilistic information a predetermined number of times that the memory device reads out the data.

Another embodiment of the present invention may provide a memory system including a storage unit, a probabilistic information generator, and an error correction block. The storage unit may be suitable for storing read out data read from a memory device. The probabilistic information generator may be suitable for updating probabilistic information based on the read out data when the read out data is stored in the storage unit. The error correction block may be suitable for performing an error correction operation on data by the updated probabilistic information. The probabilistic information generator may update the probabilistic information a predetermined number of times that the read out data is stored in the storage unit.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION

The present invention will be described more fully hereinafter with reference to the accompanying drawings, in which exemplary embodiments of the invention are shown. This invention may, however, be embodied in different forms and should not be construed as limited to the embodiments set forth herein. Throughout the disclosure, reference numerals correspond directly to the like numbered parts in the various figures and embodiments of the present invention. It is noted that in this specification, "connected/coupled" refers to one component not only directly coupling another component but also indirectly coupling another component through an intermediate component. In addition, a singular form may include a plural form as long as it is not specifically mentioned in a sentence.

Figure 1:
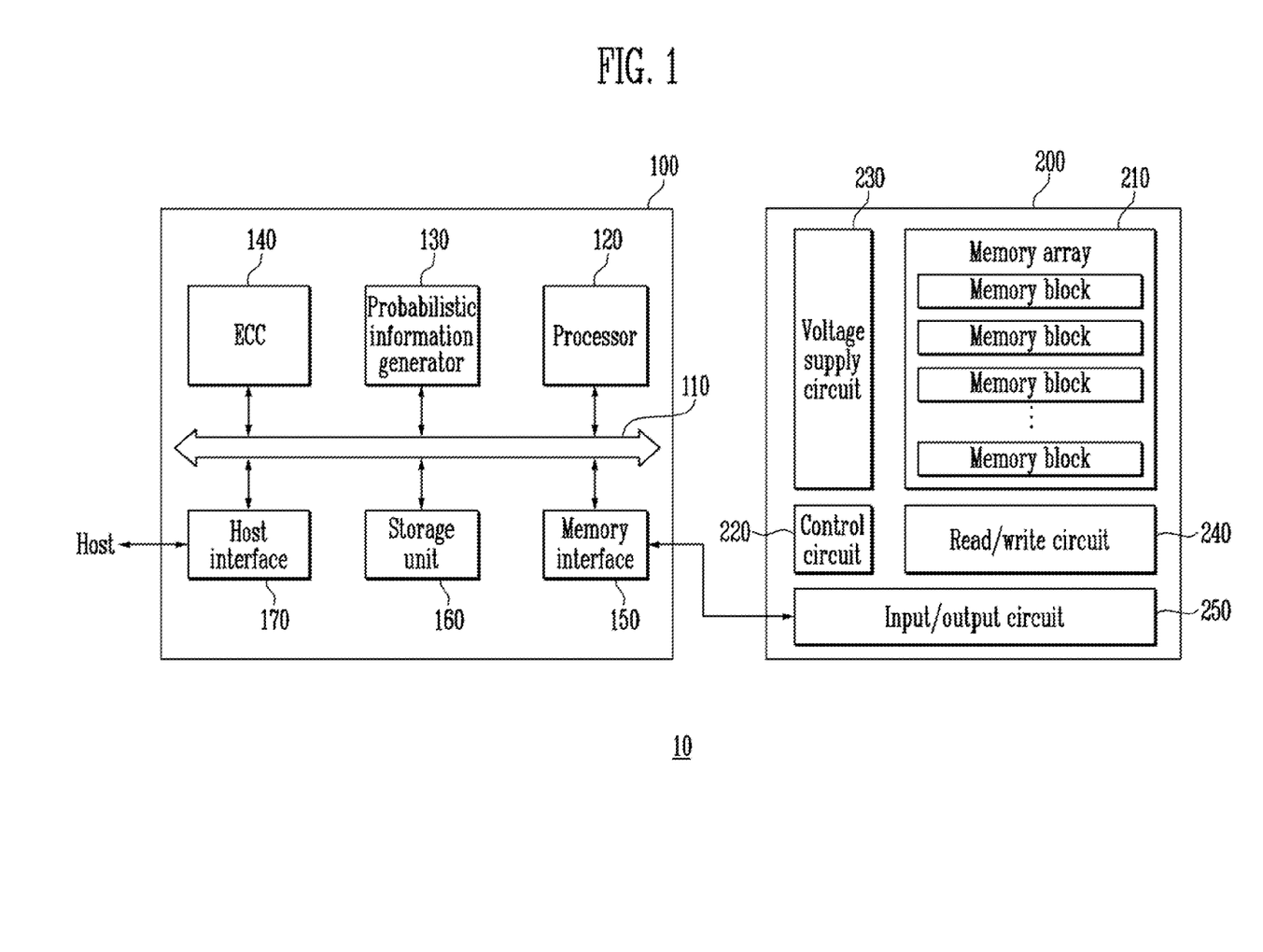
FIG. 1 is a block diagram illustrating a memory system according to an exemplary embodiment of the present invention.

FIG. 1 is a block diagram illustrating a memory system according to an exemplary embodiment of the present invention.

Referring to FIG. 1, a memory system 10 may include a controller 100 and a memory device 200. For example, the memory system 10 may be implemented using one of various storage devices, including a Solid State Drive (SSD), a Multi Media Card, such as an embedded MMC (eMMC), an Reduced Size MMC (RS-MMC) and a micro-MMC, a Secure Digital card (SD), such as a mini-SD and a micro-SD a Universal Serial Bus (USB) storage device, a Universal Flash Storage (UFS) device, a Personal Computer Memory Card International Association (PCMCIA) card, a Compact Flash (CF) card, a Smart Media card, and a Memory Stick.

The controller 100 may be connected to a host Host and the memory device 200. The controller 100 may access the memory device 200 in response to a request from the host Host. For example, the controller 100 may control a read operation, a write loop and an erase loop of the memory device 200. The controller 100 may provide an interface between the memory device 200 and the host Host. The controller 100 may drive firmware to control the memory device 200. The memory device 200 may be implemented using one of various types of non-volatile memory devices including a NAND flash memory device, a NOR flash memory device, a Ferroelectric Random Access Memory (FRAM) using a ferroelectric capacitor, a Magnetic Random Access Memory (MRAM) using a tunneling magneto-resistive (TMR) film, a Phase Change Random Access Memory (PCRAM) using chalcogenide alloys, and Resistive Random Access Memory (RERAM) using transition metal oxide. Although a NAND flash memory is illustrated as the memory device 200 in FIG. 1, the present invention is not limited. For example, the memory device 200 may be implemented in a combination of the above described various non-volatile memory devices.

The controller 100 may include an internal bus 110, processor 120, a probabilistic information generator 130, an error correction code (ECC) block 140, a memory interface 150, a storage unit 160, and a host interface 170. The internal bus 110 may provide a channel between components of the controller 100. As an example, the internal bus 110 may be a common channel used to transmit commands and data. As another example, the internal bus 110 may include a command channel and a data channel that may transmit commands and data, respectively.

The processor 120 may control the overall operation of the controller 100. The processor 120 may execute software and firmware operating in the controller 100.

The probabilistic information generator 130 may update probabilistic information in response to changed data whenever data read from the memory device 200 is input into an internal buffer (not shown) or the storage unit 160, and after the data is input by a predetermined number of times, output the updated probabilistic information. During a period when a read operation is performed to read data from memory cells in the memory device 200, the probabilistic information generator 130 of the controller 100 may update the probabilistic information by use of data input into the internal buffer or the storage unit 160. That is, the read operation of the memory device 200 and the update of the probabilistic information of the controller 100 may be simultaneously performed. Details of the probabilistic information generator 130 will be described later.

The ECC block 140 may perform an error correction operation on data by use of the probabilistic information updated by the probabilistic information generator 130.

The memory interface 150, when the memory device 200 is implemented using a NAND flash memory device, may include a protocol to communicate with the NAND flash memory device 200. For example, the memory interface 150 may include a single data rate (hereinafter, referred to as SDR) mode and a double data rate (DDR) mode that are defined by an open NAND flash interface (ONFI) specification. In addition, the memory interface mode, when the memory device 200 is implemented using a NAND flash memory device, may include a toggle mode that may be defined by a certain manufacturer's specification. The toggle mode may represent a DDR mode using a data strobe signal.

The storage unit 160 may be used as an operating memory of the processor 120, a buffer memory between the memory device 200 and the host Host, a cache memory between the memory device 200 and the host Host, or a buffer temporarily storing data input from the memory device 200. When new data is input into the storage unit 160 after the probabilistic information is updated by the probabilistic information generator 130, the storage unit 160 may store the new data in a region in which previous data may have been stored rather than in a new region. That is, when new data is input after the probabilistic information is updated, the storage unit 160 changes the stored data into the new data.

For example, the storage unit 160 may be implemented using one of various types of volatile memory devices, such as a Static RAM (SRAM), a Dynamic RAM (DRAM) and a Synchronous DRAM (SDRAM), and non-volatile memory devices such as a Ferroelectric Random Access Memory (FRAM), a Magnetic Random Access Memory (MRAM), a Phase Change Random Access Memory (PCRAM), and a Resistive Random Access Memory (RERAM). That is, the storage unit 160 may include at least one of various memories that can allow random access.

The host interface 170 may include a protocol to perform a data exchange between the host Host and the controller 100. For example, the controller 100 may communicate with the outside (host) through at least one of a Universal Flash Storage (UFS) protocol, a Universal Serial Bus (USB) protocol, a multimedia card (MMC) protocol, a peripheral component interconnect (PCI) protocol, a PCI-express (PCI-E) protocol, a Serial-ATA (Advanced Technology Attachment) protocol, a Parallel-ATA protocol, a small computer system interface (SCSI) protocol, an enhanced small disk interface (ESDI) protocol, and an Integrated Drive Electronics (IDE) protocol.

The memory device 200 may include a memory array 210 and operating circuits 220 to 250. In the following description, a NAND flash memory device is illustrated as the memory device 200.

The memory array 210 may include a plurality of memory blocks. As for the NAND flash memory device, each memory block may include a plurality of memory strings connected between bit lines and a common source line. Each memory string may include a drain select transistor connected to a bit line, a source select transistor connected to a common source line, and a plurality of memory cells connected in series between the drain select transistor and the source select transistor. The memory cells of the memory string may be connected to word lines. The memory cells connected to the word lines form a physical page. Hereinafter, this will be described in detail.

Figure 2:
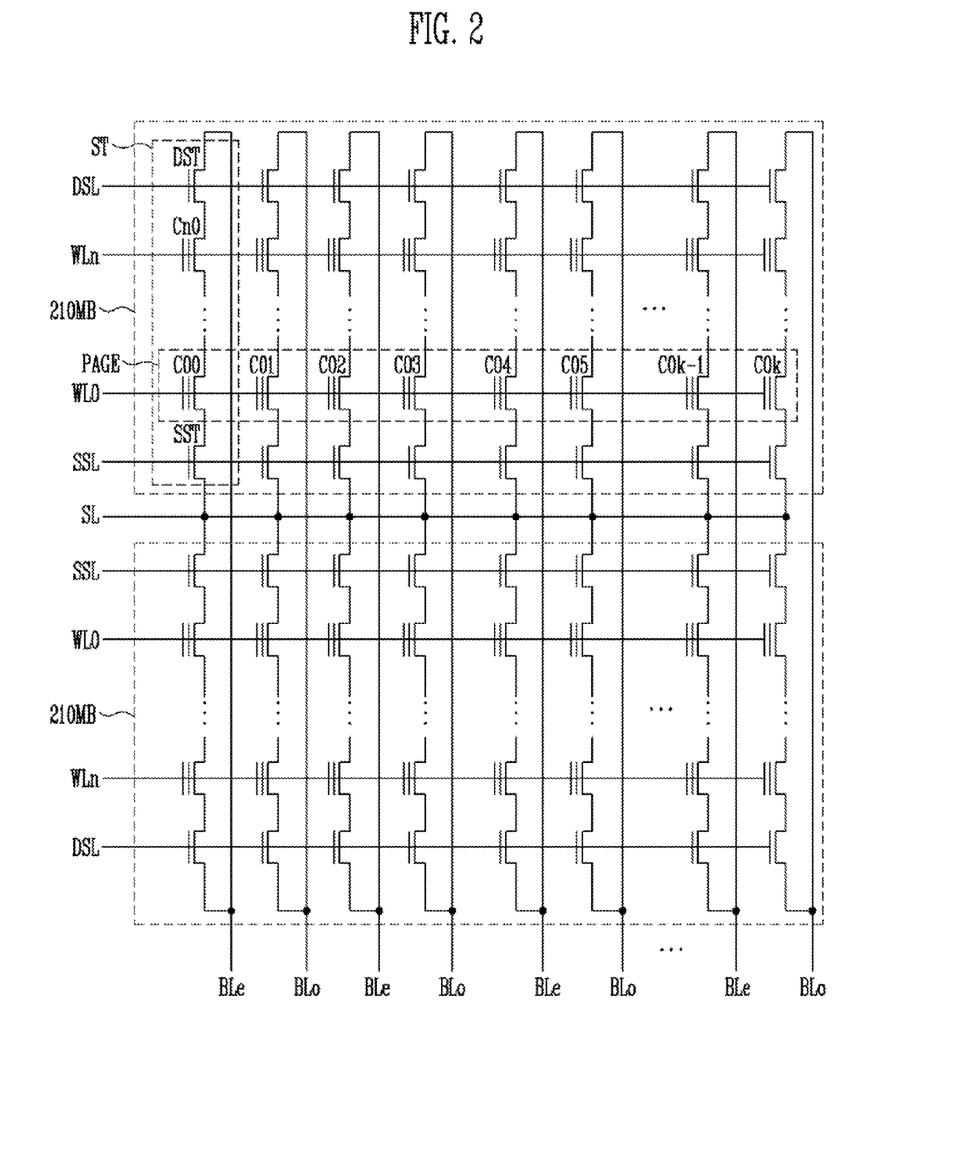
FIG. 2 is circuit diagrams illustrating a memory block shown in FIG. 1.

FIG. 2 is a circuit diagram illustrating the memory block of the memory device of FIG. 1.

Referring to FIG. 2, each memory block may include a plurality of memory strings ST connected between bit lines BL and a common source line SL. That is, the memory strings ST may be connected to the bit lines BL, respectively, and connected to the common source line SL in common. Each memory string ST may include a source select transistor SST whose source may be connected to the common source line SL, a cell string having a plurality of memory cells Ce connected in series, and a drain select transistor DST whose drain may be connected the bit line BL. The memory cells Ce included in a cell string may be connected in series between the select transistors SST and DST. A gate of the source select transistor SST may be connected to a source select line SSL, and gates of the memory cells Ce may be connected to word lines WL0 to WLn, respectively, and a gate of the drain select transistor DST may be connected to a drain select line DSL.

Here, the drain select transistor DST may control connection or interruption between the cell string Ce and the bit line BL, and the source select transistor SST may control connection or interruption between the cell string Ce and the common source line SL.

In the NAND flash memory device, memory cells included in a memory cell block may be divided on a physical page basis or logical page basis. For example, memory cells Ce and Co connected to a single word line (for example, WL0) may form a single physical page. In addition, even number memory cells Ce connected to a single word line (for example, WL0) may form a single even physical page, and odd number memory cells Co connected to a single word line (for example, WL0) may form a single odd physical page. The page (an even page or an odd page) may serve as a unit in a write operation or a read operation.

Referring again to FIG. 1, the operating circuits 220 to 250 may perform an erase loop (an erase operation and an erase verification operation), a write loop (a write operation and a write verification operation), and a read operation of a memory block. The operating, circuits include a control circuit 220, a voltage supply circuit 230, a read/write circuit 240 and an input/output circuit 250.

The control circuit 220 may control the voltage supply circuit 230, the read/write circuit 240, and the input/output circuit 250 during an erase loop, a write loop, and a read operation of memory cells.

The voltage supply circuit 230 may output operating voltages that may be required for an erase loop, a write loop and a read operation to a selected memory block.

The read/write circuit 240, during a read operation or a verification operation, may sense data stored in the memory cells by use of bit lines and latch the sensed data, or during a write operation, may selectively apply a write-inhibit voltage and a write permit voltage to bit lines according to data that may be to be stored in the memory cells. The read/write circuit 240 may be implemented using a page buffer.

The input/output circuit 250 may transmit data input from the controller 100 to the read/write circuit 240, or output data read from the memory cells to the controller 100.

The memory device 200 as such may output data read from the memory cells by use of various levels of read voltages. In detail, the memory device 200 may read data from the memory cells by use of various levels of read voltages, to distinguish a first threshold voltage distribution and a second threshold voltage distribution that may be adjacent to each other. That is, the memory device 200 may read data of the memory cells by use of read voltages between the first threshold voltage distribution and the second threshold voltage distribution or by use of read voltages belonging to a range in which the first threshold voltage distribution may overlap the second threshold voltage distribution. To this end, the memory device 200 may read data from the memory cells by sequentially using the read voltages starting from a low level read voltage to a high level read voltage. In addition, the memory device 200 may read data from the memory cells by sequentially using the read voltages starting from the high level read voltage to the low level read voltage.

The controller 100 and the memory device 200 described above may be integrated into a single semiconductor device. For example, the controller 100 and the memory device 200 may be integrated into a single semiconductor device, forming a solid state drive (SSD). The controller 100 and the non-volatile memory device 200 may be integrated into a single semiconductor device, forming a memory card. For example, the controller 100 and the non-volatile memory device 200 may be integrated into a single semiconductor device, forming a memory card, such as a PC card (personal computer memory card international association (PCM-CIA)), a compact flash card (CF), a smart media card (SM, SMC), a memory stick, a multimedia card (MMC, RS-MMC, MMCmicro), an SD card (SD, miniSD, microSD, and a secure digital high capacity (SDHC)), a universal flash storage (UFS).

As another example, the memory system 10 may form a computer, a Ultra Mobile PC (UMPC), a workstation, a netbook, a personal digital assistant (PDA), a portable computer, a web tablet, a table computer, a wireless phone, a mobile phone, a smartphone, an e-book, a portable multimedia player (PMP), a portable game console, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device forming a data center, a device capable of transmitting/receiving information in a wireless environment, one of various electronic devices forming a home network, one of various electronic devices forming a computer network, one of various electronic devices forming a telematics network, an RFID device, or one of various parts forming a computing system.

Figure 3:
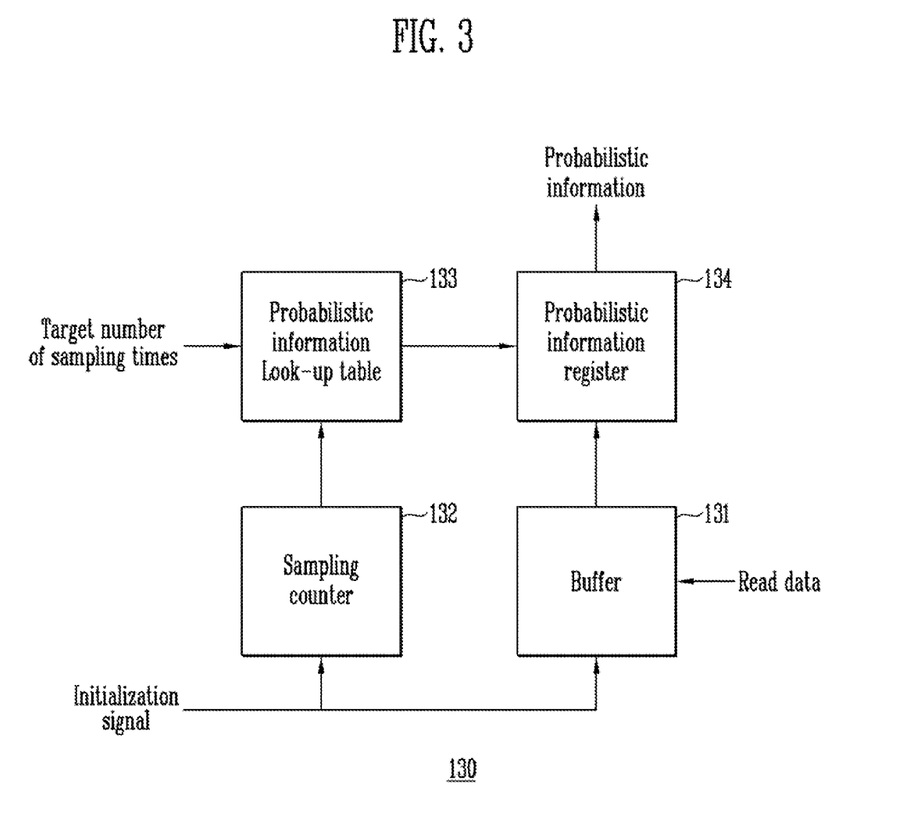
FIG. 3 is a block diagram illustrating a probabilistic information generator shown in FIG. 1.

Hereinafter, the probabilistic information generator 130 will be described in detail. FIG. 3 is a block diagram illustrating a probabilistic information generator 130 shown in FIG. 1.

Referring to FIG. 3, the probabilistic information generator 130 may include a sampling counter 132, a probabilistic information lookup table 133, a buffer 131, and a probabilistic information register 134. The probabilistic information generator 130 may generate the probabilistic information, and whenever data read from the memory device is input from the memory device 200, may update the probabilistic information.

The sampling counter 132 may count a number of inputs of the data from the memory device 200. That is, the sampling counter 132 may count the number of times that data is input from the memory device into the buffer 131 or the storage unit 160 of the controller 100 for the generation and update of the probabilistic information. The number of input times of the data may be the same as the number of times that the memory device 200 performs read operations. The sampling counter 132 may be initialized in response to an initialization signal before probabilistic information is generated.

The probabilistic information lookup table 133 may, in response to an output signal of the sampling counter 132, provide the probabilistic information register 134 with information for updating the probabilistic information. The probabilistic information lookup table 133 may generate the probabilistic information used for the ECC block 140 to perform error correction. The probabilistic information lookup table 133 may change an amount of the information for updating the probabilistic information depending on a target number of input times of the data or target amount of the data input from the memory device 200, which is required for the update of the probabilistic information.

The buffer 131 may store data input from the memory device 200. When new data read by a read voltage of a different level is input from the memory device 200, the probabilistic information generator 130 may replace data previously stored in the buffer 131 with the currently new data. For this reason, the buffer 131 may have as small capacity as possible to store input data required for the update of the probabilistic information. Accordingly, the buffer 131 with such a small capacity may prevent increase of a chip size. Before probabilistic information is generated, the buffer 131 may be initialized in response to the initialization signal.

The probabilistic information register 134 may update the probabilistic information in response to data output from the buffer 131 and information provided from the probabilistic information lookup table 133. The detailed operation of the probabilistic information register 134 will be described later.

Hereinafter, the operation of the memory system will be described.

Figure 4:
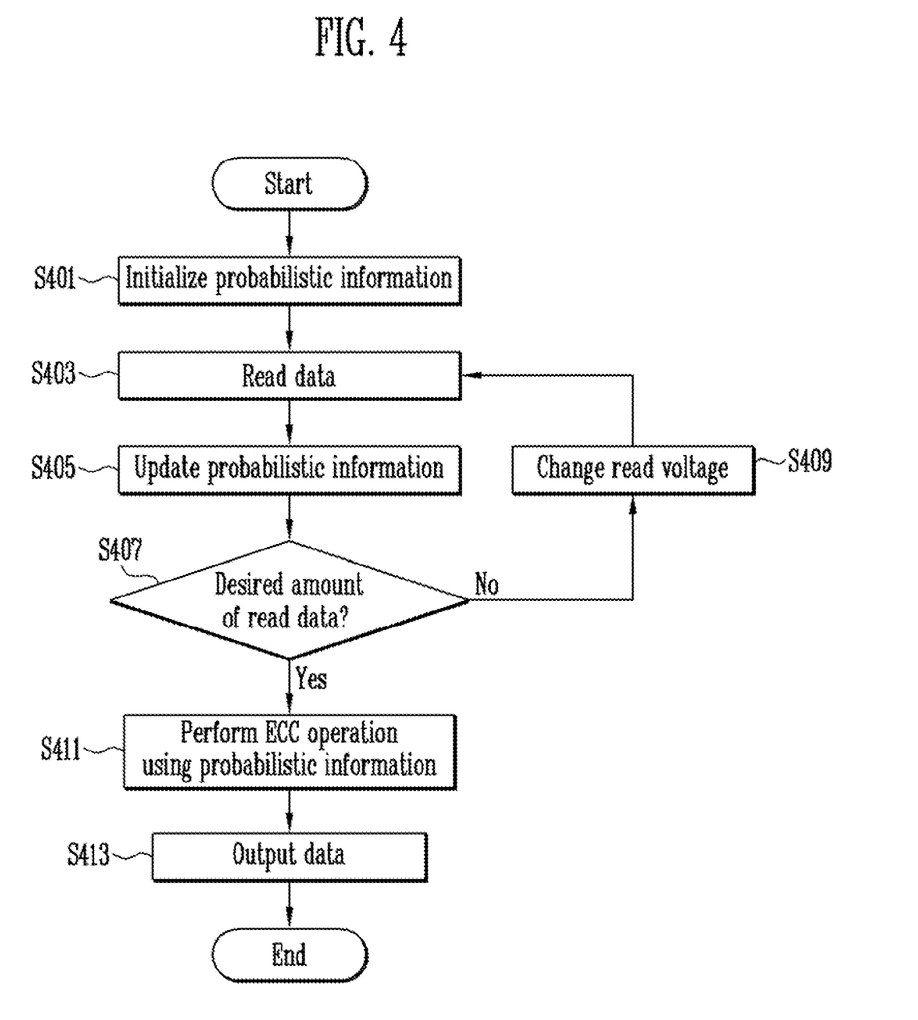
FIG. 4 is a flowchart illustrating an operation of the memory system according to an exemplary embodiment of the present invention.

FIG. 4 is a flowchart illustrating an operation of the memory system 10 according to an exemplary embodiment of the present invention. FIGS. 5 to 8 are drawings illustrating the operation of the memory system 10 according to an exemplary embodiment of the present invention system.

Figure 5:
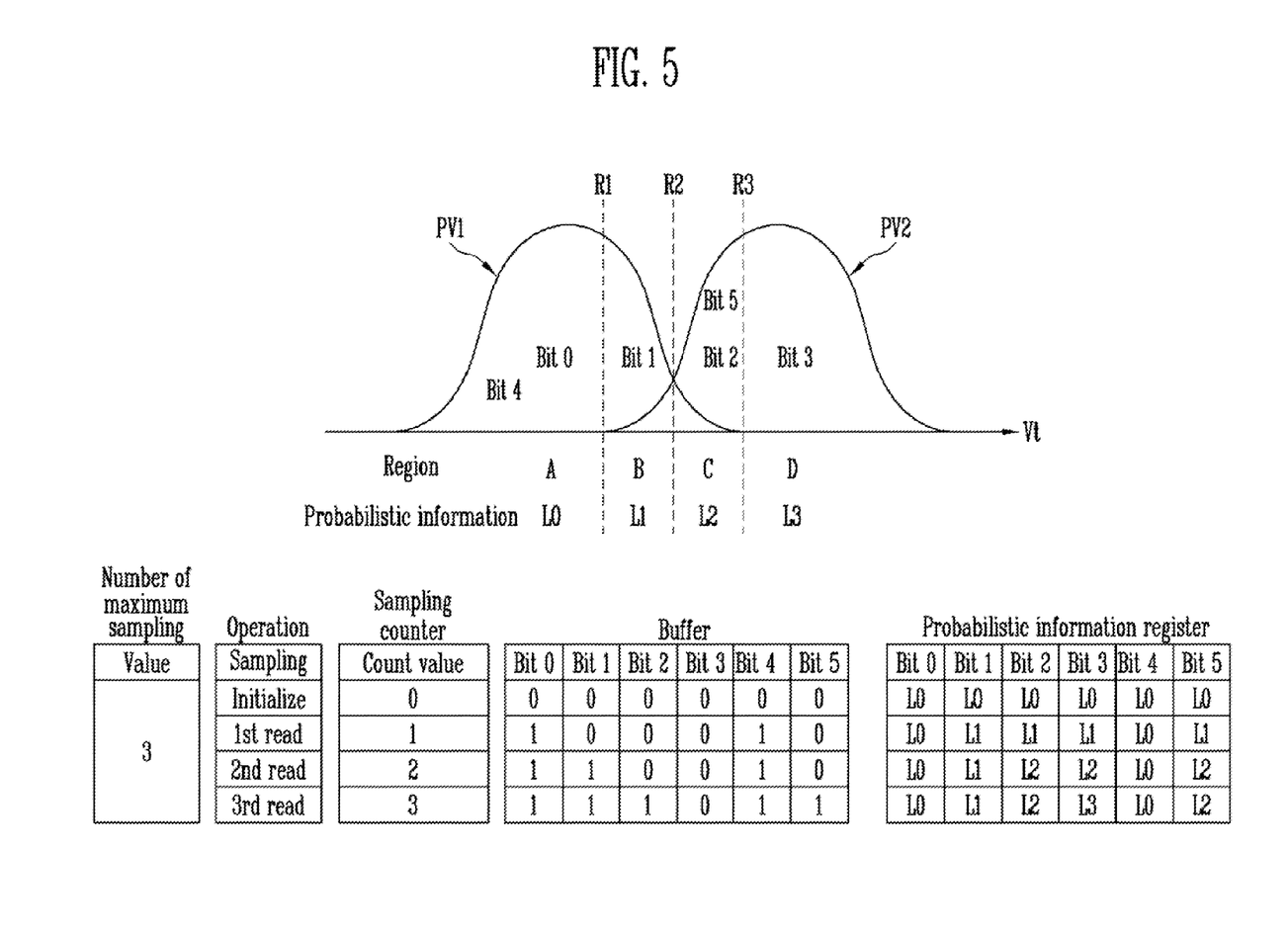
FIGS. 5 to 8 are drawings illustrating an operation of the memory system according to an exemplary embodiment of the present invention.

Referring to FIGS. 3 to 5, a probabilistic information initialization operation may be performed (S401). The following description is made in relation to a case that three pieces of data read by use of three read voltages R1 to R3 for the generation and update of the probabilistic information. Accordingly, the target number of input of data for data sampling may be set to 3.

In response to the initialization signal, the sampling counter 132 of the probabilistic information generator 130 may be initialized. As a result, a count value of the sampling counter 132 may be set to 0. For the sake of convenience, the probabilistic information of each memory cell in the probabilistic information register 134 may be set to 'L0'. For example, the probabilistic information may include probabilities represented by 'L0' to 'L3' that the memory cells belong to specific region in threshold voltage distributions of the memory cells.

Data may be read out from the memory device (S403). For example, the memory device 200 may perform a read operation on first one of first to sixth memory cells (the total of six memory cells for convenience) by use of a first read voltage R1. At the first time of data read out, the count value of the sampling counter 132 may be '1'. For example, first to sixth data Bit0 to Bit5 respectively corresponding to the first to sixth memory cells read by the first read voltage R1 may be '100010'. That is, the first and fifth data Bit0 and Bit4 of the first and fifth memory cells whose threshold voltages may belong to a first region A have a value '1', and the second to fourth and sixth data Bit1 to Bit3 and Bit5 of the remaining memory cells have a value '0'. The first to sixth data Bit0 to Bit5 may be stored into the buffer 131. As an example, FIG. 5 shows first and second threshold voltage distributions PV1 and PV2, wherein the average threshold voltage of the second threshold voltage distribution PV2 is higher than that of the first threshold voltage distribution PV1 and the first and second threshold voltage distributions PV1 and PV2 partly overlap, and whose region is divided into first to fourth regions A to D by the levels of first to third read voltages R1 to R3. Voltage levels of the regions and the read voltages in ascending order may be the first to fourth Regions A, B, C and D and the first to third read voltages R1, R2, and R3, respectively. The level of the second read voltage R2 may indicate the center of the overlapped area of the first and second threshold voltage distributions PV1 and PV2.

Probabilistic information stored in the probabilistic information register 134 may be updated in response to the first to sixth data Bit0 to Bit5 firstly stored in the buffer 131 (S405). For example, the first and fifth memory cells corresponding to the first and fifth data Bit0 and Bit4, which are read out as '1.' by the lowest first read voltage R1, may belong to the first region A. The first to sixth data Bit0 to Bit5 '100010' read out by the first read voltage R1 may show with high probability that the first and fifth memory cells, which correspond to the first and fifth data Bit0 and Bit4 read out as '1' by the lowest first read voltage R1 belong to the first threshold voltage distribution PV1 or the first region A, and the probabilistic information corresponding to the first and fifth memory cell may be updated to 'L0' representing the high probability. Meanwhile, the probabilistic information of the second, third, fourth, and sixth memory cells corresponding to the second, third, fourth, and sixth data Bit1, Bit2, Bit3, and Bit5, which are read as '0' by the lowest first read voltage R1, may be updated tentatively to 'L1'. At this moment, it is not certain which one of the first and second threshold voltage distributions PV1 and PV2 the second, third, fourth, and sixth memory cells belong to. Accordingly, the probabilistic information register 134 may update the probabilistic information of the second, third, fourth, and sixth memory cells, which correspond to the read out data of '0' in the first read data '100010' stored in the buffer 131, tentatively to 'L1' corresponding to probability of belong to the region B. The update may be made according to information provided by the probabilistic information lookup table 133.

It may be determined whether all data required for probabilistic information update is input (S407). That is, it may be determined whether all the three pieces of read out data may be input from the memory device 200. The step of S407 may be performed by checking whether the count value of the sampling counter 132 is 3.

Two more pieces of data may need to be input at this moment of the update with the read out data by the first read voltage R1 and therefore the first read voltage R1 may be changed to a second read voltage R2 (S409), and a second read data may be read by the second read voltage R2 (S403).

For example, the memory device 200 may perform the read operation on the first to sixth memory cells by use of the second read voltage R2. At the second time of data read out, the count value of the sampling counter 132 may be '2'. For example, the first to sixth data Bit0 to Bit5 respectively corresponding to the first to sixth memory cells read by the second read voltage R2 may be '110010'. That is, the first, second and fifth data Bit0, Bit1, and Bit4 of the first, second, and fifth memory cells whose threshold voltages may belong to the first region A and the second region B have a value "1", and the third, fourth and sixth data Bit2, Bit3, and Bit5 of the remaining memory cells have a value '0'. The first to sixth data Bit0 to Bit5 may be stored into the buffer 131.

The probabilistic information stored in the probabilistic information register 134 may be updated in response to the secondly read out first to sixth data Bit0 to Bit5 stored in the buffer 131 (S405). For example, compared to the firstly read out and stored first to sixth data '100010' the secondly read out and stored first to sixth data '110010' shows that the second data Bit1 of the second memory cell has been changed, which may show with a certain probability that the threshold voltage of the second memory cell belongs to the second region B, and the probabilistic information corresponding to the second memory cell may be updated to 'L1' representing the certain probability.

Meanwhile, the probabilistic information of the third, fourth, and sixth memory cells corresponding to the third, fourth, and sixth data Bit2, Bit3, and Bit5 which are read as '0' by the second read voltage R2, may be updated tentatively to 'L2'. At this moment, it is not certain which one of the first and second threshold voltage distributions PV1 and PV2 the third, fourth, and sixth memory cells belong to. Accordingly, the probabilistic information register 134 may update the probabilistic information of the third, fourth, and sixth memory cells, which correspond to the read out data of '0' in the second read data '110010' stored in the buffer 131, tentatively to 'L2' corresponding to probability of belong to the region C. The update may be made according to information provided from the probabilistic information lookup table 133.

It may be determined whether all the data required for probabilistic information update is input (S407). A third read data may need to be input at this moment of the update with the read out data by the second read voltage R2, and thus the second read voltage R2 may be changed to a third read voltage R3 (S409). The third read data may be read by the third read voltage R3 (S403). The second data stored in the buffer 131 may be changed to the third data.

Subsequently, the probabilistic information stored in the probabilistic information register 134 may be updated in response to the thirdly read out first to sixth data Bit0 to Bit5 stored in the buffer 131 (S405). For example, compared to the secondly read out and stored first to sixth data '110010', the thirdly read out and stored first to sixth data '111011' shows that the third and sixth data Bit2 and Bit5 of the third and sixth memory cells have been changed, which may show with a certain probability that the threshold voltages of the third and sixth memory cells belong to the third region C, and the probabilistic information corresponding to the third and sixth memory cells may be updated to 'L2' representing the certain probability. Meanwhile, the probabilistic information of the fourth memory cell corresponding to the fourth data Bit3, which is read as '0' by the third read voltage R3, may be updated to 'L3'. At this moment, it is certain with high probability that the fourth memory cell belongs to the second threshold voltage distribution PV2.

The probabilistic information register 134 may update the probabilistic information of the fourth memory cell, which corresponds to the read out data of '0' in the third read data '111011' stored in the buffer 131, to 'L3' corresponding to the high probability of belonging to the region D. The update may be made according to information provided from the probabilistic information lookup table 133.

Since all the three pieces of read data may be input (S407), it may be determined that all the data required for probabilistic information update is input. That is, the probabilistic information update may be completed.

As for the threshold voltages of the first to sixth memory cells, the threshold voltages of the first and fifth memory cells are determined to belong in the first region A with high probability, which is represented by the probabilistic information 'L0', and thus proved to be included in the first threshold voltage distribution PV1, and the threshold voltage of the fourth memory cell is determined to belong in the fourth region D with high probability, which is represented by the probabilistic information 'L3', and thus proved to be included in the second threshold voltage distribution PV2. However, the threshold voltages of the second, third, and sixth memory cells are determined to belong in the second and third regions B and C with the certain probability of belonging to one of the threshold voltage distributions PV1 and PV2, which means that it is not certain which one of the first and second threshold voltage distributions PV1 and PV2 the second, third, and sixth memory cells belong to. Accordingly, the threshold voltage distributions to which the second, third, and sixth memory cells belong may be determined with the probabilistic information 'L1' and 'L2' representing the certain probability.

The probabilistic information generated by the probabilistic information generator 130 may be input into the ECC block 140 (S411), and the ECC block 140 may correct errors of the data read out from the memory device 200 through an error checking and correction (ECC) operation using the probabilistic information. That is, the error correction may be performed using the probabilistic information generated through the three pieces of firstly to thirdly read out data. For example, the values of the first to sixth data Bit0 to Bit5 of the memory cells may be determined according to the probabilistic information. Since the first and fifth data Bit0 and Bit4 of the first and fifth memory cells of the high probability are highly likely to have a value '1' and thus determined to have the value of 1', and the fourth data Bit3 of the fourth memory cells of the high probability is highly likely to have a value '0' and thus determined to have the value of '0'. Meanwhile, the second, third and sixth data Bit1, Bit2, and Bit4 of the second, third and sixth memory cells of the certain probability are not highly likely to have the value '1' or '0', and thus each of the second, third and sixth data Bit1, Bit2, and Bit5 of the second, third and sixth memory cells is randomly determined to have the value of '1' or '0' according to the respective probabilistic information 'L1' and 'L2' representing the certain probability. The ECC block 140 may correct errors of the data determined with the probabilistic information, and checks whether the error correction succeeds.

If the error correction does not succeed, the ECC block 140 may change the probabilistic information according to a pattern determined by an internal algorithm. In this case, the ECC block 140 may especially change probabilistic information of the second, third and sixth memory cells having the certain probability. According to the changed probabilistic information, the values of the first to sixth data Bit0 to Bit5 of the first to sixth memory cells may be determined again. At this time, mainly the second, third and sixth data Bit1, Bit2, and Bit5 of the memory cells having the certain probability may be changed. Errors of the data determined by the changed probabilistic information may be corrected through the ECC operation, and it may be checked whether the error correction succeeds. The ECC block 140 may iteratively perform the changing of the probabilistic information, the ECC operation, and the success check until normal data is obtained.

After the error correction is completed, the controller 100 may output the normal data having errors corrected to the host Host (S413).

The above description has been made in relation to a case that the total of three read voltages are sequentially used staring from the lowest level to the highest level to sample three pieces of data. However, according to another example, the total of three read voltages may be sequentially used staring from the highest level to the lowest level.

Figure 6:
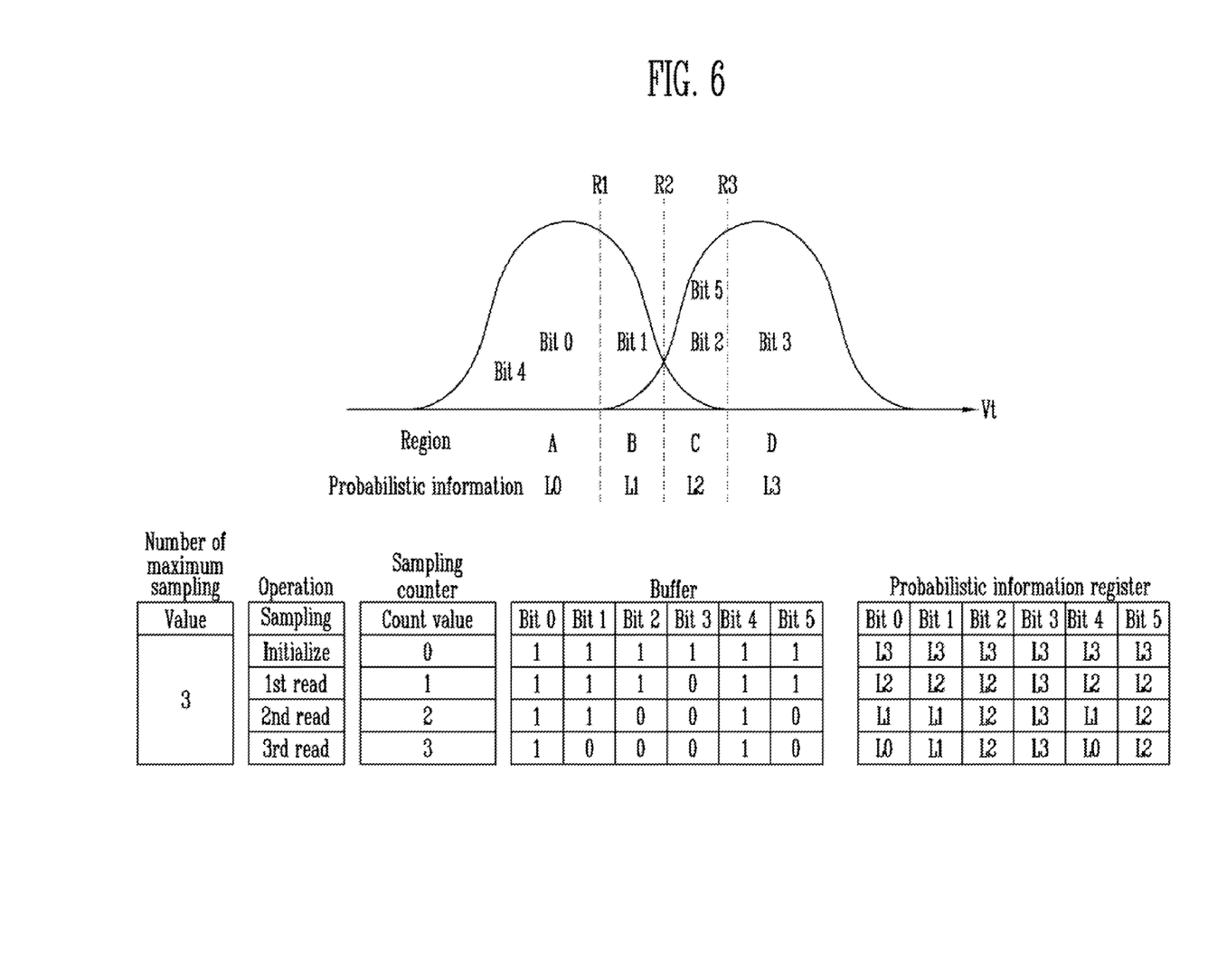

Referring to FIGS. 4 to 6, all probabilistic information in the probabilistic information register 130 may be set to 'L3' (S401). FIG. 6 shows the same first and second threshold voltage distributions PV1 and PV2, first to third read voltages R1 to R3, first to fourth regions A to D, and probabilistic information 'L0' to 'L3' as FIG. 5. A first read operation may be performed on the first to sixth memory cells by the third read voltage R3 (S403). The first to sixth data Bit0 to Bit5 may be firstly read out as '111011' from the memory cells by the first read operation. The probabilistic information stored in the probabilistic information register 130 may be updated according to the firstly read out data Bit0 to Bit5 and information provided from the probabilistic information lookup table 133 (S405). That is, probabilistic information of the first, second, third, fifth, and sixth memory cells each having data '1' may be updated from 'L3' to 'L2' according to the information of the probabilistic information lookup table 133.

The third read voltage R3 may be changed to the second read voltage R2 (S407 and S409), and a second read operation may be performed on the memory cells by the second read voltage R2 (S403). A secondly read out data Bit0 to Bit5 '110010' may be output from the memory cells by the second read operation. The probabilistic information stored in the probabilistic information register 134 may be updated according to the secondly read out data Bit0 to Bit5 and information from the probabilistic information lookup table 133 (S405). That is, the probabilistic information of the first, second, and fifth memory cells each having data '1' may be updated from 'L2' to 'L' according to the information of the probabilistic information lookup table 133.

The second read voltage R2 may be changed to the first read voltage R1 (S407 and S409), and a third read operation may be performed on memory cells by the first read voltage R1. A thirdly read out data Bit0 to Bit5 '100010' may be output from the memory cells by the third read operation (S403). The probabilistic information stored in the probabilistic information register 134 may be updated according to the thirdly read out data Bit0 to Bit5 and information from the probabilistic information lookup table 133 (S405). That is, the probabilistic information of the first and fifth memory cells each having data '1' may be updated from 'L1' to 'L0' according to the information of the probabilistic information lookup table 133.

When the probabilistic information update is completed, the ECC operation may be performed using the probabilistic information (S411), and when the error correction is completed, the data having errors corrected may be output (S413).

The above description has been made in relation to a case that three pieces of data are sampled to perform the probabilistic information update. However, according to another example, five pieces of data may be sampled using five read voltages to perform a probabilistic information update.

Figure 7:
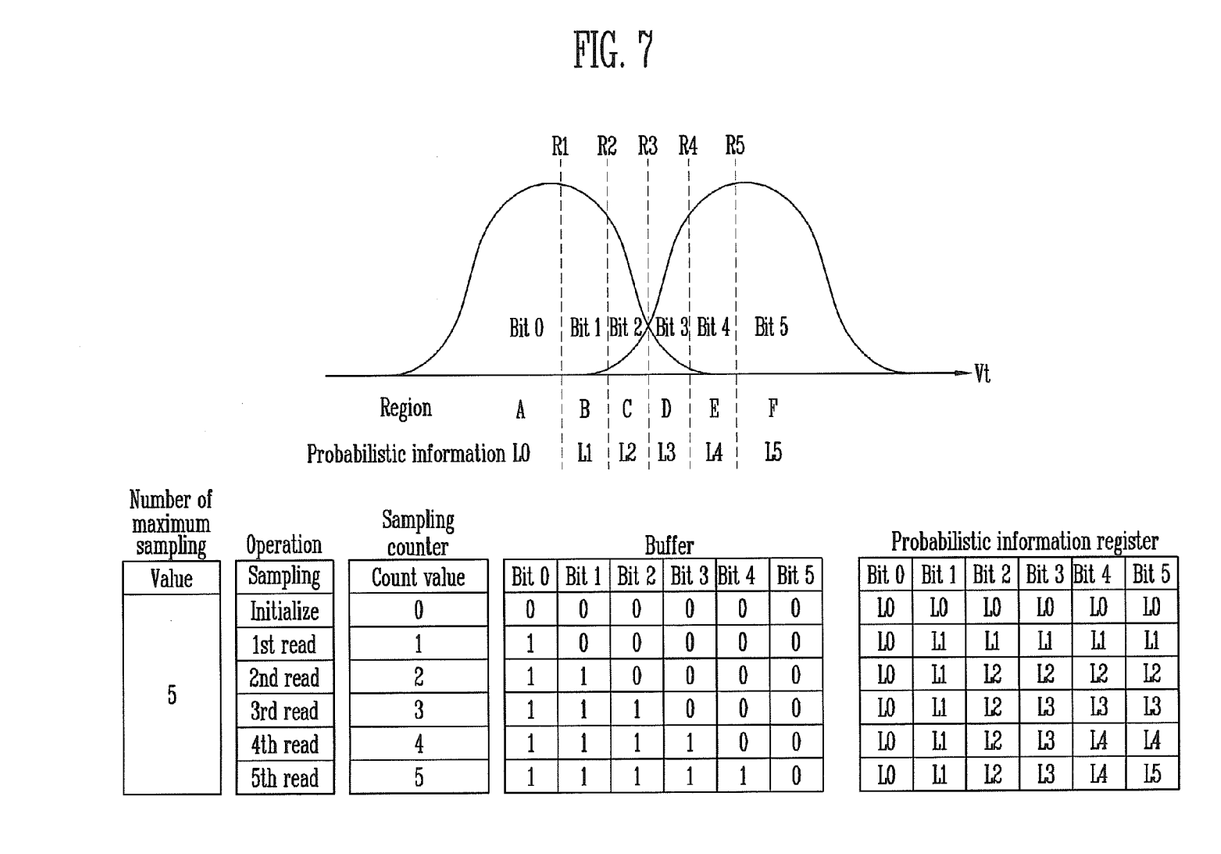

Referring to FIGS. 4 and 7, although the operation of the memory system is achieved by using five read voltages R1 to R5 (S401 to S413), the operation may be implemented in the same manner as that shown in FIG. 5. As an example, FIG. 7 shows the first and second threshold voltage distributions PV1 and PV2, wherein the average threshold voltage of the second threshold voltage distribution PV2 is higher than that of the first threshold voltage distribution PV1 and the first and second threshold voltage distributions PV1 and PV2 partly overlap, and whose region is divided into first to sixth regions A to F by the levels of first to fifth read voltages R1 to R5. Voltage levels of the regions and the read voltages in ascending order may be the first to sixth Regions A, B, C, D, E, and F and the first to fifth read voltages R1, R2, R3, R4 and R5, respectively. The level of the third read voltage R3 may indicate the center of the overlapped area of the first and second threshold voltage distributions PV1 and PV2.

The probabilistic information in the probabilistic information register 134 may be set to 'L0' (S401). The first read operation may be performed on the first to sixth memory cells by the first read voltage R1 (S403). A firstly read out data Bit0 to Bit5 '100000' may be read from the memory cells by the first read operation. The probabilistic information stored in the probabilistic information register 134 may be updated according to the firstly read out data Bit0 to Bit5 '100000' and information from the probabilistic information lookup table 133. That is, the probabilistic information of the second to sixth memory cells each having data Bit1 to Bit5 of the value '0' may be updated tentatively to 'L1' according to the information of the probabilistic information lookup table 133.

The second read operation may be performed (S407, S409, and S403), and a secondly read out data Bit0 to Bit5 '110000' may be read from the memory cells. The probabilistic information of the third to sixth memory cells each having data Bit2 to Bit5 of the value '0' may be updated tentatively to 'L2' (S405).

Likewise, as operations of S407, S409, S403, and S405 are iteratively performed, first to sixth data Bit0 to Bit5 may be read from the memory cells by the first to fifth read voltages R1 to R5, and the probabilistic information may be updated five times by the firstly to fifthly read out data Bit0 to Bit5 thereby sequentially being read out as '100000', '110000', '111000', '111100', and '111110'.

When the probabilistic information update is completed, the ECC operation may be performed using the probabilistic information (S411) and when the error correction is completed, the data having errors corrected may be output (S413).

Although the above description is made for the case of the five pieces of read out data Bit0 to Bit5, the probabilistic information generator 130 may replace data Bit0 to Bit5 previously read out and stored in the buffer 131 with the newly read out data Bit0 to Bit5. For this reason, the buffer 131 may have as small capacity as possible to store the first to sixth data Bit0 to Bit5 required for the update of the probabilistic information. Accordingly, the buffer 131 with such a small capacity may prevent increase of a chip size. Before probabilistic information is generated, the buffer 131 may be initialized in response to the initialization signal.

In addition, since the first to fifth read voltages R1 to R5 are used in this embodiment of the present invention, the read operation and the probabilistic information update may be performed two times more than the previous embodiments of the first to third read voltages R1 to R3, and thus the error correction performance may be improved.

The above description has been made in relation that the five read voltages are sequentially used starting from the lowest level to the highest level, to sample five pieces of data. However, according to another example, five read voltages may be used starting from the highest level to the lowest level.

Figure 8:
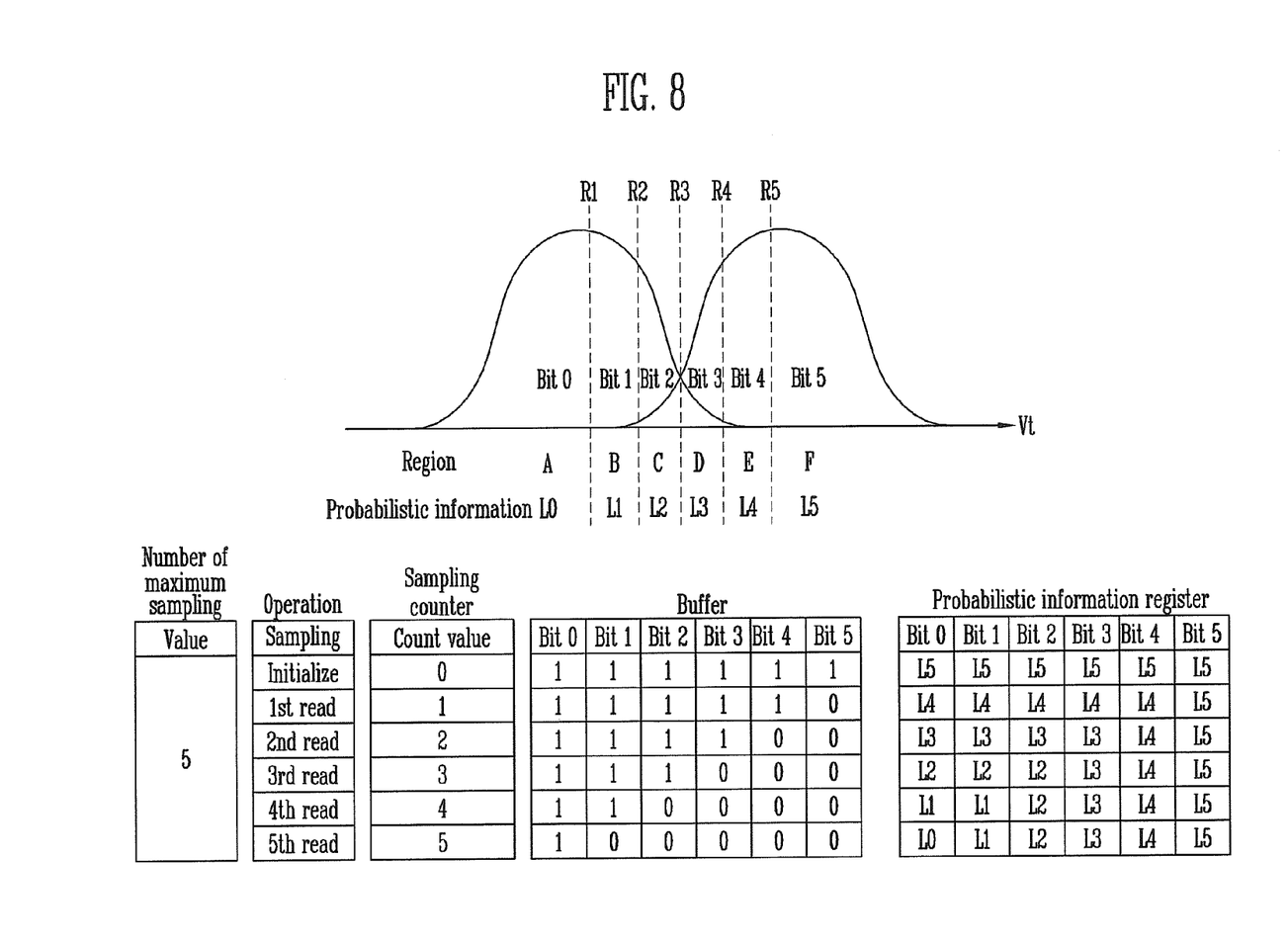

Referring to FIGS. 4 and 8, the operation of the memory system is achieved by sequentially using the five read voltages R5 to R1 (S401 to S413) starting from the highest level, but is implemented in the same manner as that shown in FIG. 7. FIG. 8 shows the same first and second threshold voltage distributions PV1 and PV2, first to fifth read voltages R1 to R5, first to sixth regions A to F, and probabilistic information 'L0' to 'L5' as FIG. 7.

The probabilistic information in the probabilistic information register 134 may be set to 'L5' (S401). The first read operation may be performed on the memory cells by the fifth read voltage R5 (S403). A firstly read out data Bit0 to Bit5 '111110' may be read from the memory cells by the first read operation. The probabilistic information stored in the probabilistic information register 134 may be updated according to the firstly read out data Bit0 to Bit5 '111110' and information from the probabilistic information lookup table 133. That is, the probabilistic information of the first to fifth memory cells each having data Bit0 to Bit4 of the value '1' may be updated tentatively to 'L4' according to the information of the probabilistic information lookup table 133.

The second read operation may be performed (S407, S409, and S403), and a secondly read out data Bit0 to Bit5 '111100' may be read from the memory cells. Then, the probabilistic information of the first to fourth memory cells each having data Bit0 to Bit5 of the value '1' may be updated tentatively to 'L3' (S405).

Likewise, as operations of S407, S409, S403, and S405 are iteratively performed, first to sixth data Bit0 to Bit5 may be read from the memory cells by the fifth to first read voltages R5 to R1, and the probabilistic information may be updated five times by the firstly to fifthly read out data Bit0 to Bit5 thereby sequentially being read out as '111110', '111100', '111000', '110000' and '100000'.

When the probabilistic information update is completed, the ECC operation may be performed using the probabilistic information (S411), and when the error correction is completed, the data having errors corrected may be output (S413).

According to the present invention, the data reliability can be improved while efficiently providing supplementary information required for error correction without increasing the chip size.

In the drawings and specification, there have been disclosed typical exemplary embodiments of the invention and, although specific terms are employed, they are used in a generic and descriptive sense only and not for purposes of limitation. As for the scope of the invention, it is to be set forth in the following claims. Therefore, it will be understood by those of ordinary skill in the art that various changes in form and details may be made therein without departing from the spirit and scope of the present invention as defined by the following claims.

What is claimed is:

1. A memory system comprising:
a memory device configured to read out normal data from memory cells, and read out sampling data including N units of sampling data from the memory cells by use of a plurality of read voltages, the N units of sampling data being output N times with one unit of sampling data per time, N being a natural number greater than 1; and
a controller configured to generate probabilistic information, and update the probabilistic information based on the sampling data input from the memory device, and configured to perform an error correction operation, to correct errors in the normal data, by use of the updated probabilistic information,
wherein the controller repeatedly updates the probabilistic information whenever at least one unit of the sampling data is input to the controller, and
the controller performs the error correction operation after the N units of sampling data are input from the memory device.

2. The memory system of claim 1, wherein the controller updates the probabilistic information based on a first unit of sampling data among the sampling data while the memory device reads out a second unit of sampling data among the sampling data from the memory cells.

3. The memory system of claim 1, wherein the controller further comprises a buffer configured to store the sampling data.

4. The memory system of claim 3, wherein the controller replaces a first unit of sampling data, among the sampling data, previously stored in the buffer with a second unit of sampling data, among the sampling data, read out currently.

5. The memory system of claim 1, wherein the controller comprises:
a probabilistic information generator configured to update the probabilistic information based on the sampling data when the memory device reads out the sampling data and provides the sampling data to the controller, and
an error correction block configured to perform the error correction operation by the probabilistic information updated by the probabilistic information generator.

6. The memory system of claim 5, wherein the probabilistic information generator comprises:
a sampling counter configured to generate a count value representing a number of times that the memory device provides the sampling data to the controller;
a probabilistic information lookup table configured to provide information for updating the probabilistic information in response to the count value;
a buffer configured to store the sampling data; and
a probabilistic information register configured to update the probabilistic information based on the sampling data stored in the buffer and the information provided from the probabilistic information lookup table.

7. The memory system of claim 6, wherein an amount of the information provided from the probabilistic information lookup table varies depending on the N times.

8. The memory system of claim 6, wherein the probabilistic information generator replaces a first unit of sampling data, among the sampling data, previously stored in the buffer with a second unit of sampling data, among the sampling data, read out currently.

9. The memory system of claim 1, wherein the memory device sequentially uses the read voltages in ascending order of voltage levels to read the sampling data from the memory cells.

10. The memory system of claim 1, wherein the memory device sequentially uses the read voltages in descending order of voltage levels to read the sampling data from the memory cells.

11. The memory system of claim 1, wherein the memory device reads the sampling data from the memory cells by use of the read voltages to distinguish a first threshold voltage distribution and a second threshold voltage distribution that are adjacent to each other.

12. A memory system comprising:
a storage unit configured to store sampling data input from a memory device;
a probabilistic information generator configured to generate probabilistic information, and update the probabilistic information based on the sampling data when the sampling data is stored in the storage unit; and
an error correction block configured to perform an error correction operation on normal data, input from the memory device, for correcting errors in the normal data by the updated probabilistic information,
wherein the probabilistic information generator updates the probabilistic information N times that the sampling data is input to the storage unit, N being a natural number greater than 1, and
the error correction block performs the error correction operation after the probabilistic information generator updates the probabilistic information N times.

13. The memory system of claim 12, wherein the probabilistic information generator updates the probabilistic information based on a first unit of sampling data among the sampling data while a second unit of sampling data among the sampling data is read from the memory device.

14. The memory system of claim 12, wherein a first unit of sampling data, among the sampling data, previously stored in the storage unit is replaced with a second unit of sampling data, among the sampling data, read out currently.

15. The memory system of claim 12, wherein the probabilistic information generator comprises:
a sampling counter configured to generate a count value representing a number of times that the sampling data is input to the storage unit;
a probabilistic information lookup table configured to provide information for updating the probabilistic information in response to the count value; and
a probabilistic information register configured to update the probabilistic information based on the sampling data stored in the storage unit and the information provided from the probabilistic information lookup table.

16. The memory system of claim 15, wherein an amount of the information provided from the probabilistic information lookup table varies depending on the N times.

* * * * *